United States Patent
Lee et al.

(10) Patent No.: US 8,656,582 B2
(45) Date of Patent: Feb. 25, 2014

(54) METHOD OF ATTACHING DIE USING SELF-ASSEMBLING MONOLAYER AND PACKAGE SUBSTRATE INCLUDING DIE ATTACHED THERETO USING SELF-ASSEMBLING MONOLAYER

(75) Inventors: Seung Seoup Lee, Gyunggi-do (KR); Soon Gyu Yim, Gyunggi-do (KR); Jong Woo Han, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 463 days.

(21) Appl. No.: 12/424,494

(22) Filed: Apr. 15, 2009

(65) Prior Publication Data

US 2010/0187002 A1   Jul. 29, 2010

(30) Foreign Application Priority Data

Jan. 29, 2009   (KR) ..................... 10-2009-0007003

(51) Int. Cl.
*H05K 3/30*   (2006.01)
*H01L 21/00*   (2006.01)

(52) U.S. Cl.
USPC ........................................... 29/832; 438/106

(58) Field of Classification Search
USPC ............ 29/832, 831, 834, 739; 438/106, 107, 438/121, 125, 126, 127
See application file for complete search history.

(56) References Cited

U.S. PATENT DOCUMENTS

| | | | | |
|---|---|---|---|---|
| 5,188,984 A | * | 2/1993 | Nishiguchi | 438/107 |
| 5,545,291 A | * | 8/1996 | Smith et al. | 438/107 |
| 6,291,896 B1 | * | 9/2001 | Smith | 257/786 |
| 6,309,912 B1 | * | 10/2001 | Chiou et al. | 438/118 |
| 6,417,025 B1 | * | 7/2002 | Gengel | 438/107 |
| 7,251,882 B2 | * | 8/2007 | Ricks et al. | 29/832 |
| 7,364,983 B2 | * | 4/2008 | Wang et al. | 438/458 |
| 7,622,813 B2 | * | 11/2009 | Brewer | 257/797 |
| 7,629,026 B2 | * | 12/2009 | Sharma et al. | 427/256 |
| 7,730,610 B2 | * | 6/2010 | Nakagawa et al. | 29/831 |
| 7,847,394 B2 | * | 12/2010 | Dubin et al. | 257/706 |
| 7,867,563 B2 | * | 1/2011 | Arase et al. | 427/266 |
| 7,972,875 B2 | * | 7/2011 | Rogers et al. | 438/21 |
| 7,982,296 B2 | * | 7/2011 | Nuzzo et al. | 257/679 |

(Continued)

FOREIGN PATENT DOCUMENTS

KR   10-0661695   12/2006

OTHER PUBLICATIONS

Bohringer, K., et al., "Modeling of Capillary Forces and Binding Sites for Fluidic Self-Assembly," IEEE International Conference on Digital Object Identifier, MEMS 2001, pp. 369-374 (Jan. 2001).*

(Continued)

*Primary Examiner* — David Angwin
(74) *Attorney, Agent, or Firm* — Blakely, Sokoloff, Taylor & Zafman, LLP

(57) ABSTRACT

Disclosed herein are a method of attaching a die using a self-assembling monolayer and a package substrate including a die attached thereto using a self-assembling monolayer. A first self-assembling monolayer formed on a die and a second self-assembling monolayer formed on a substrate are provided with the same hydrophilic or hydrophobic functional group, so that the die is attached to the substrate using an attractive force acting between the first and second self-assembling monolayers. An accuracy of alignment between the die and the substrate can be improved by the simple solution.

11 Claims, 10 Drawing Sheets

(56) References Cited

U.S. PATENT DOCUMENTS

| | | | | |
|---|---|---|---|---|
| 8,039,847 B2* | 10/2011 | Nuzzo et al. | .................... | 257/79 |
| 8,097,926 B2* | 1/2012 | De Graff et al. | .............. | 257/419 |
| 8,114,567 B2* | 2/2012 | Webster et al. | ............ | 430/270.1 |
| 8,133,768 B2* | 3/2012 | Ray et al. | ...................... | 438/141 |
| 8,182,303 B2* | 5/2012 | Ray et al. | ...................... | 445/24 |
| 8,183,772 B2* | 5/2012 | Ray et al. | ..................... | 313/512 |
| 8,198,621 B2* | 6/2012 | Rogers et al. | .................... | 257/9 |
| 8,217,381 B2* | 7/2012 | Rogers et al. | .................... | 257/9 |
| 8,349,653 B2* | 1/2013 | Parvarandeh | ................ | 438/109 |
| 8,350,703 B2* | 1/2013 | Gengel et al. | ............. | 340/572.7 |
| 8,367,035 B2* | 2/2013 | Rogers et al. | ............. | 423/447.3 |
| 8,372,726 B2* | 2/2013 | de Graff et al. | .............. | 438/457 |
| 2002/0153606 A1* | 10/2002 | Gengel | ........................ | 257/700 |
| 2003/0117770 A1* | 6/2003 | Montgomery et al. | ....... | 361/687 |
| 2006/0090885 A1* | 5/2006 | Montgomery et al. | .. | 165/104.33 |
| 2007/0237703 A1* | 10/2007 | Zhang et al. | .............. | 423/445 B |
| 2011/0192445 A1* | 8/2011 | Solzbacher et al. | .......... | 136/246 |

OTHER PUBLICATIONS

Office Action from counterpart Korean Patent Application No. 10-2009-0007003, Dec. 28, 2010, 5 pages.

Bohringer, K., et al., "Modeling of Capillary Forces and Binding Sites for Fluidic Self-Assembly", IEEE International Conference on Digital Object Identifier, MEMS2001, pp. 369-374.

* cited by examiner

METHOD OF ATTACHING DIE USING SELF-ASSEMBLING MONOLAYER AND PACKAGE SUBSTRATE INCLUDING DIE ATTACHED THERETO USING SELF-ASSEMBLING MONOLAYER

CROSS REFERENCE TO RELATED APPLICATION

This application claims the benefit of Korean Patent Application No. 10-2009-0007003, filed Jan. 29, 2009, entitled "A method for die attach using self-assemble monolayer and a package substrate attached die using the self-assemble monolayer", which is hereby incorporated by reference in its entirety into this application.

BACKGROUND OF THE INVENTION

1. Field of the Invention

The present invention relates to a method of attaching a die using a self-assembling monolayer and a package substrate including a die attached thereto using a self-assembling monolayer.

2. Description of the Related Art

Currently, electronics industries are making efforts to provide reliable electronic products which are miniaturized and reduced in weight and have multifunctionality and high performance. One of technologies which enable these goals to be accomplished is a packaging technology. In particular, a SIP (System In Packaging) technology based on a printed circuit board, which is one of packaging technologies for improving a surface-mount efficiency, is being intensively studied.

The SIP technology may be classified into a surface-mount technology (SMT) in which a die is mounted on a surface of a printed circuit board and an embedded active die (EAD) technology in which a die is mounted in a printed circuit board, any of which is performed using a die attach apparatus.

FIG. 1 is a schematic view showing a conventional die attach apparatus. The conventional die attach apparatus and a method of attaching a die using the die attach apparatus are now described with reference to FIG. 1.

As shown in FIG. 1, the conventional die attach apparatus 10 comprises a die loading unit 20, a slide glass 30, visual cameras 30a and 30b, and a die bonding unit 40.

The die loading unit 20, which is intended to pick up individual dies D which are diced from a wafer W and to transfer the dies to the slide glass 30, comprises a pickup head 22 for loading. In this regard, the die D is provide thereon with pads P and is provided at a bottom surface with a die attach film (DAF) attached thereto.

The slide glass 30 functions to allow positions of corners of the die D and positions of the pads P to be recognized by the visual cameras 30a and 30b, and is made of transparent material. In other words, disposition of the die D on the transparent slide glass 30 enables the visual cameras 30a and 30b to detect positions of corners of the die D and positions of the pads P.

The visual cameras 30a and 30b is intended to recognize positions of corners of the die D and positions of the pads P, and are composed of an upper visual camera 30a positioned above the slide glass 30 and a lower visual camera 30a positioned below the slide glass 30.

The die bonding unit 40 is intended to pick up the die D and to attach the die D to a substrate 50, and includes a pickup head 42 for bonding. The die bonding unit 40 attaches the die D to the substrate 50, based on the positions of corners of the die D and positions of the pads P detected by the visual cameras 30a and 30b.

However, in order to attach the die D to the substrate 50 using such a conventional die attach apparatus 10, the slide glass 30 and the image recognition process using the slide glass 30 are absolutely required. In this regard, because dicing errors are incurred in the course of dicing individual dies from a wafer W, all of positions of corners of the die D and positions of the pads P must be detected so as to reduce errors in alignment, as shown in FIG. 2. To this end, use of the slide glass 30 is essential so as to detect both upper and lower surfaces of the die D using the visual cameras 30a and 30b.

The image recognition process using the slide glass 30 has problems in that the process time is extended because the process is executed in a manner such that the die D is loaded and placed on the slide glass 30, positions of corners and pads of the die D are recognized using the visual cameras 30a and 30b, and the die D is picked up by the die bonding unit 40 and then mounted on the substrate 50.

Furthermore, because the die D is firmly adhered to the slide glass 30 owing to adhesive force of a die attach film (DAF) attached to a lower surface of the die D, it is hard to separate the die D from the slide glass 30 in the course of pickup of the die D.

In addition, when the lower visual camera 30b recognizes positions of corners of the die D through the slide glass 30, intensity of reflected light is reduced due to low reflective force of the die attach film DAF, thus severely deteriorating a recognition rate of the positions of corners.

SUMMARY OF THE INVENTION

Accordingly, the present invention has been made keeping in mind the above problems occurring in the related art, and the present invention provides a method of attaching a die using a self-assembling monolayer and a package substrate including a die attached thereto using a self-assembling monolayer, which can reduce errors in mounting of die using self alignment of a self-assembling monolayer.

In one aspect, the present invention provides a method of attaching a die using a self-assembling monolayer, comprising: (A) forming a first self-assembling monolayer on one side of a die including a pad on the other side; (B) forming a second self-assembling monolayer on a die attach region on a substrate; and (C) picking up the die using a pickup head, and transferring the die to the die attach region of the substrate so that the die is automatically aligned with the substrate using an attractive force acting between the first and second self-assembling monolayers.

In another aspect, the present invention provides a package substrate including a die attached thereto using a self-assembling monolayer, the package substrate comprising: a die including a pad on one side thereof and a first self-assembling monolayer on the other side thereof; and a substrate including a second self-assembling monolayer on a die attach region thereof, wherein the die is attached to and mounted on the substrate using an attractive force acting between the first and second self-assembling monolayers.

The first self-assembling monolayer formed on the die and the second self-assembling monolayer formed on the substrate have a hydrophilic or hydrophobic functional group. Since the first and second self-assembling monolayers have the same functional group, they align themselves using an attractive force acting therebetween.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
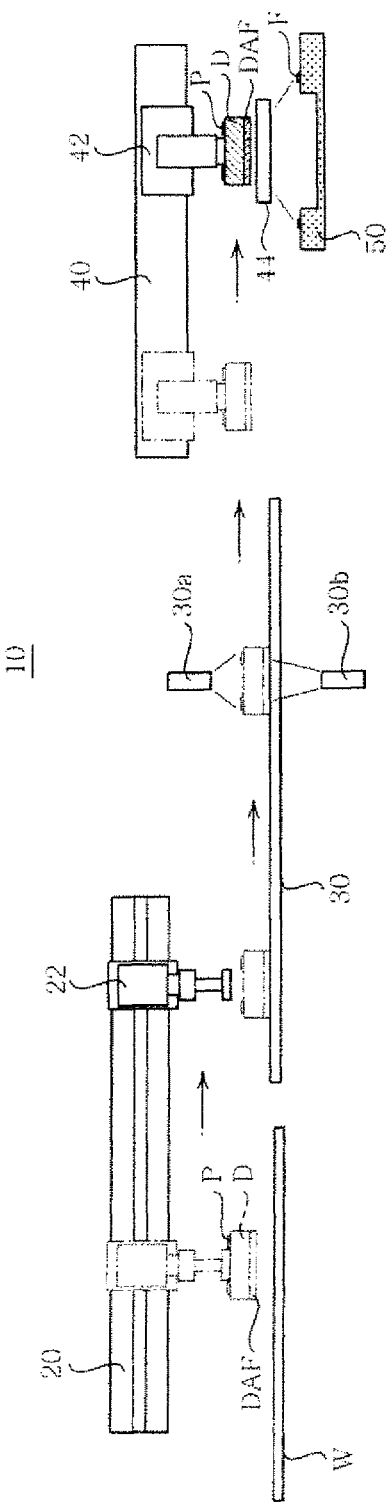
FIG. 1 is a schematic view showing a conventional die attach apparatus.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

In the following detailed description, it should be noted that the terms "first", "second" and the like are not intended to indicate a specified amount, sequence or significance but intended to differentiate constituent elements. Furthermore, in designation of reference numerals, it should be noted that the same reference numerals are used throughout the different drawings to designate the same or similar components. Also, in the description of the present invention, when it is considered that the detailed description of a related art may obscure the gist of the present invention, such detailed description may be omitted.

Hereinafter, embodiments of the present invention will be described in greater detail with reference to the following drawings.

Figure 2:
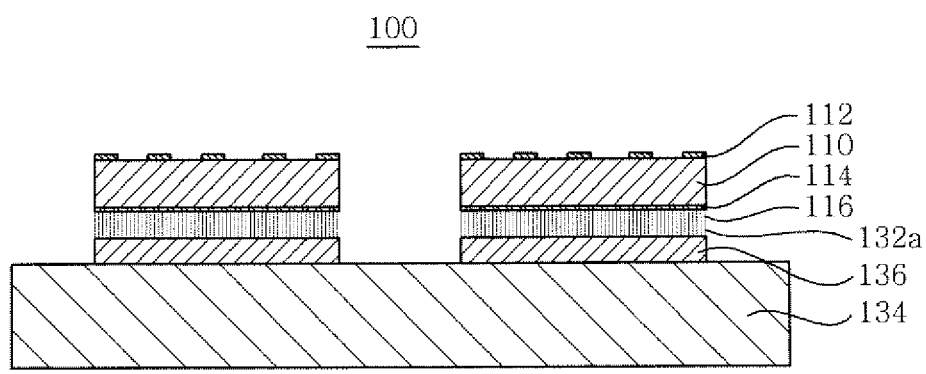
FIG. 2 is a cross-sectional view of a package substrate which includes a die attached thereto using a self-assembling monolayer, according to an embodiment of the present invention.

A Package Substrate Including a Die Attached Thereto Using a Self-Assembling Monolayer FIG. 2 is a cross-sectional view of a package substrate which includes a die attached thereto using a self-assembling monolayer, according to an embodiment of the present invention.

As shown in FIG. 2, the package substrate 10 which includes a die attached thereto using a self-assembling monolayer, according to this embodiment, comprises a die 110 which includes pads 112 disposed on one side thereof and a first self-assembling monolayer 116 disposed on the other side thereof, and a substrate 134 which includes a second self-assembling monolayer 132a disposed on a die attach region, wherein the die 110 is adhered and thus mounted on the substrate 134 due to an attractive force acting between the first and second self-assembling monolayers 116 and 132a.

The die 110 further includes an insulating film 114 on the other side thereof so as to facilitate formation of the first self-assembling monolayer 116. The insulating film 114 may be made of, for example, an oxide film selected from the group consisting of $SiO_2$, $Si_3N_4$, $TiO_2$, $ZrO_2$ and $HfO_2$ or a silicon nitride ($Si_3N_4$).

For easy formation of the first self-assembling monolayer 116, for example, a gold (Au) thin film 136 is formed on the die attach region of the substrate 134.

The first and second self-assembling monolayer 116 and 132a may have the same functional group R, for example, a hydrophilic or hydrophobic functional group, such that they align themselves using an attractive force acting therebetween.

A Method of Attaching a Die Using a Self-Assembling Monolayer

Figure 3:
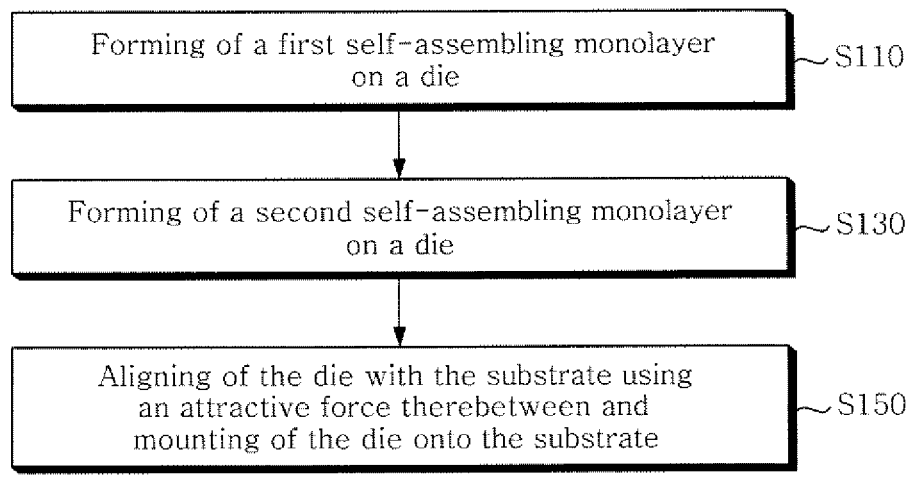
FIG. 3 is a flow chart showing a method of attaching a die using a self-assembling monolayer, according to an embodiment of the present invention.

FIG. 3 is a flow chart showing a method of attaching a die using a self-assembling monolayer, according to an embodiment of the present invention, and FIGS. 4 to 22 are cross-sectional views sequentially showing a process of attaching a die using a self-assembling monolayer, according to an embodiment of the present invention.

Hereinafter, the process of attaching a die using a self-assembling monolayer, according to this embodiment of the present invention will be described with reference to FIGS. 3 to 22.

As shown in FIG. 3, the process of attaching a die using a self-assembling monolayer, according to this embodiment of the present invention, comprises the steps of forming a first self-assembling monolayer on a die (S110), forming a second self-assembling monolayer on a substrate (S130), and aligning the die with the substrate using an attractive force therebetween and mounting the die onto the substrate (S150). The steps of the process are now described with reference to drawings corresponding to the respective steps.

In the step (S110), a first self-assembling monolayer 116 is formed on one side of a die 110 having pads 112 on the other side. FIGS. 4 to 7 are drawings showing a process corresponding to the step (S110).

Figure 4:
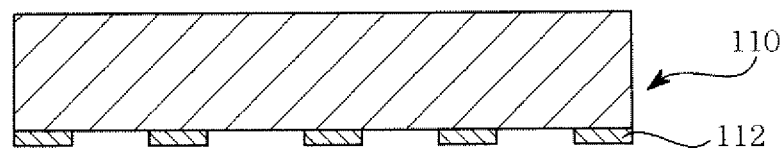
FIGS. 4 to 22 are cross-sectional views sequentially showing a process of attaching a die using a self-assembling monolayer, according to an embodiment of the present invention.

As shown in FIG. 4, a die 110 having pads 112 on one side thereof is first prepared.

At this point, the die 110 is configured such that a silicon chip body including an integrated circuit (not shown) incorporated therein is provided at one side with the pads 112 that is electrically connected to the integrated circuit.

Figure 5:
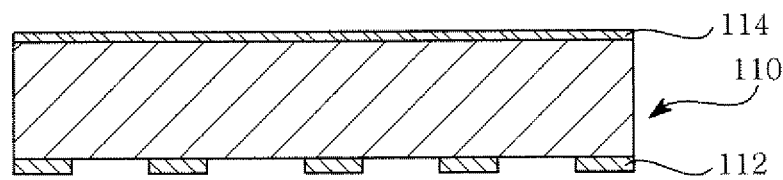

As shown in FIG. 5, an insulating film 114 is formed on the other side of the die 110.

At this time, the insulating film 114 may be made of, for example, an oxide film selected from the group consisting of $SiO_2$, $Si_3N_4$, $TiO_2$, $ZrO_2$ and $HfO_2$ or a silicon nitride film.

In this embodiment, $SiO_2$ may be used because it can be formed by heating a silicon (Si) wafer. More specifically, by heating the other side of the die 110 that is a silicon wafer, the insulating film 114 of $SiO_2$ can be formed on the other side of the die 110.

Meanwhile, when organic materials are present on the insulating film 114, a homogeneous first self-assembling monolayer cannot be achieved in the subsequent process of forming the first self-assembling monolayer. For this reason, a process of washing the insulating film 114 may be executed. For example, this process may be executed in a manner such that the die 110 is immersed in detergent which is prepared by mixing sulfuric acid ($H_2SO_4$) and hydrogen peroxide ($H_2O_2$) at a mixing ratio of 4:1, and is then rinsed with DI (Deionized) water.

Figure 6:
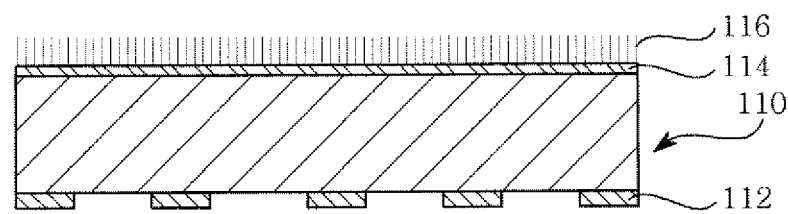

As shown in FIG. 6, a first self-assembling monolayer (SAM) 116 is formed on the insulating film 114 of the die 110.

In this regard, the first self-assembling monolayer 116 may be embodied as, for example, an alkylsilane monolayer formed on the insulating film 114.

Figure 7:
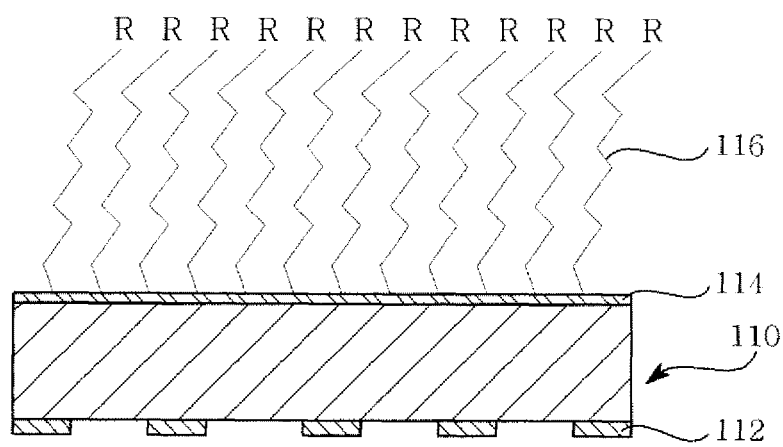

As shown in FIG. 7, the first self-assembling monolayer 116 may have a hydrophilic or hydrophobic functional group (R) at the end thereof such that it can be aligned with an after-mentioned second self-assembling monolayer 132a of a substrate 134 using an attractive force acting therebetween. For example, the hydrophobic functional group (R) may be formed through an acidic etching process or a plasma (e.g., $O_2$ Plasma) process.

In the step (S130), a second self-assembling monolayer 132a is formed on a die attach region of the substrate 134. FIGS. 8 to 16 are drawings showing a process corresponding to the step (S130).

FIGS. 8 to 12 are drawings showing an embodiment of a process corresponding to the step (S130). The process of forming the second self-assembling monolayer 132a on the substrate 134 will be now described with reference to the drawings.

Figure 8:
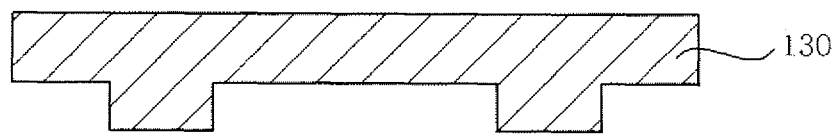

As shown in FIG. 8, a transfer stamp 130 having a predetermined structure is first prepared.

At this point, the transfer stamp 130 may be configured to have a predetermined structure such that the second self-assembling monolayer 132a can be formed on a desired region of the substrate 134. For example, the transfer stamp 130 has raised portions 103a and depressed portions 130b alternately arranged thereon such that the raised portions 130a are positioned to correspond to the regions on the substrate 134 on which the second self-assembling monolayer 132a is formed.

The transfer stamp 130 may be made of silicon rubber or polydimethylsiloxane (PDMS).

Figure 9:
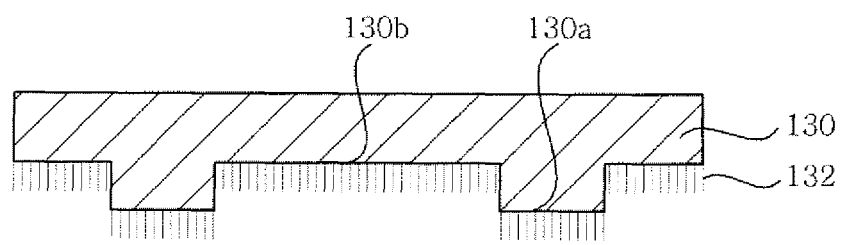

As shown in FIG. 9, a self-assembling monolayer 132, which is to be transferred later, is formed on the transfer stamp 130.

The self-assembling monolayer 132 may be formed in a manner such that the transfer stamp 130 is dipped into a solution in which self-assembling molecules are dissolved, and is then dried to remove the solution adhering thereto. Alternatively, the self-assembling monolayer 132 may be formed by coating the transfer stamp 130 with solution containing self-assembling molecules dissolved therein through a spin coating process.

Figure 10:
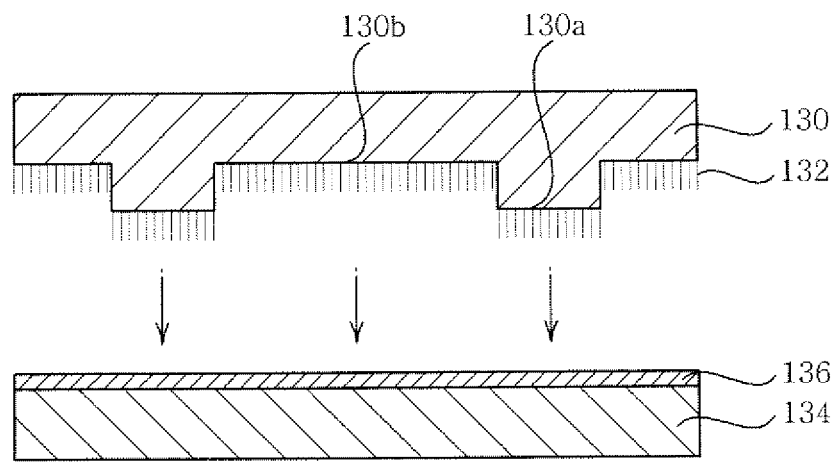

As shown in FIG. 10, the transfer stamp 130 is brought into contact with the substrate 134 through a contact printing process.

At this point, the substrate 134 may be formed with a gold (Au) thin film 136 so as to facilitate the transfer of the self-assembling monolayer 132 to the substrate 134. Meanwhile, since the self-assembling monolayer 132 can be transferred to a desired region on the substrate 134 according to the structure of the transfer stamp 130, the gold (Au) thin film 136 does not need to be patterned.

Figure 11:
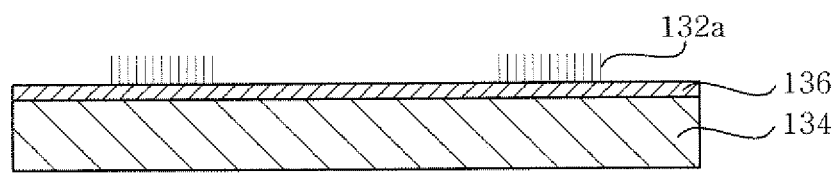

As shown in FIG. 11, after the contact printing process, the transfer stamp 130 is removed from the substrate 134, thus forming a second self-assembling monolayer 132a.

At this point, the transfer stamp 130 may be efficiently peeled off from the substrate 134 in a manner such that the transfer stamp 130, which is made of transparent material, is irradiated with ultraviolet laser, for example, excimer laser beam so as to generate gas between the transfer stamp 130 and the second self-assembling monolayer 132a using absorbed energy from the laser beam.

Figure 12:
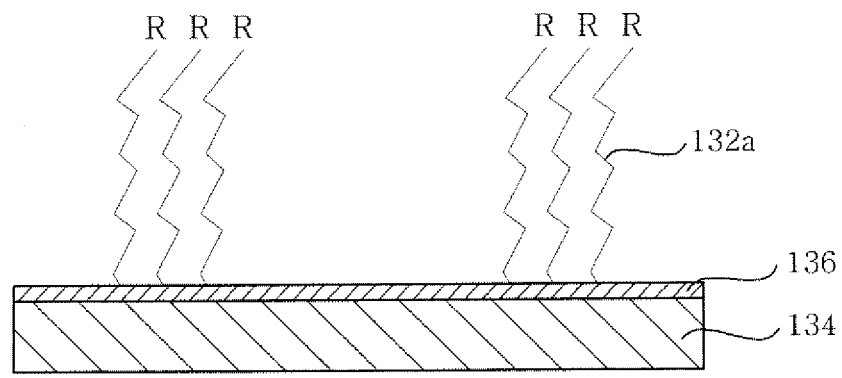

As shown in FIG. 12, the second self-assembling monolayer 132a may have the same hydrophilic or hydrophobic functional group (R) as that of the after-mentioned first self-assembling monolayer 116 of the die 110 such that they align themselves using an attractive force acting therebetween.

FIGS. 13 to 16 are drawings showing another embodiment of the process corresponding to the step (S130). The process of forming the second self-assembling monolayer 132a on the substrate 134 will be now described with reference to the drawings.

Figure 13:
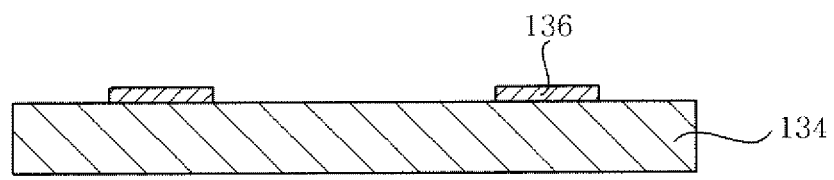

As shown in FIG. 13, a gold (Au) thin film 136 is first formed on a die attach region on the substrate 134.

At this point, the gold (Au) thin film 136 may be formed by applying a gold (Au) thin layer on the substrate 134 and patterning the gold (Au) thin layer so as to cause the gold (Au) thin film 136 to be formed only on the die attach region.

In this embodiment, although the gold (Au) thin film 136 is illustrated in FIG. 13 as being formed on the substrate 134 for convenience of illustration of explanation, a configuration in which the substrate 134 has a die-receiving cavity and the gold (Au) thin film is formed in the cavity, should also be construed as falling within the scope of the present invention.

Figure 14:
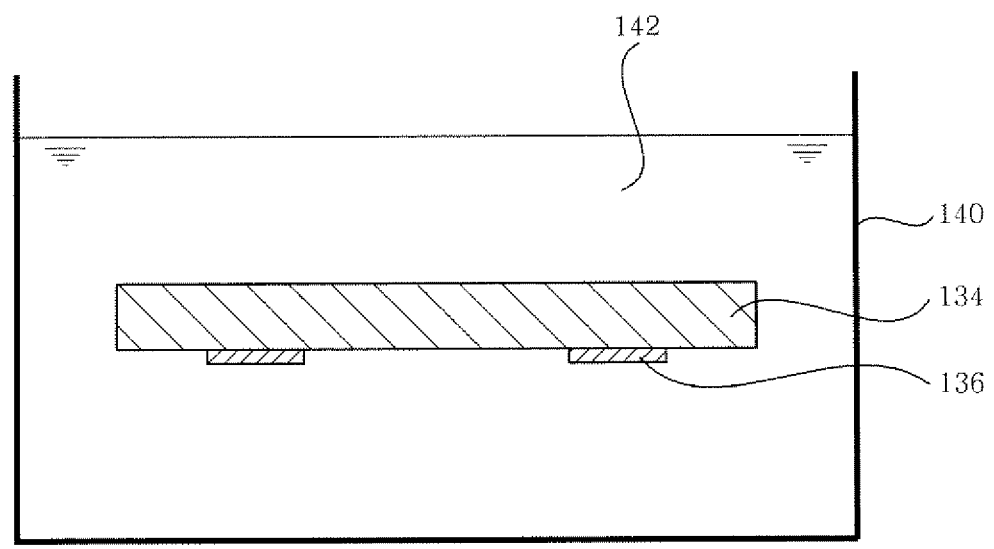

As shown in FIG. 14, the substrate 134 which includes the gold (Au) thin film 136 formed thereon is immersed into a solution 142 contained in a chamber 140 in which self-assembling molecules are dissolved.

Specifically, the chamber 140 contains the solution 142 which is composed of solvent such as ethanol and self-assembling molecules such as alkane thiol dissolved in the solvent. When the substrate 134 is immersed in the solution 142, thiol groups aggregate on the gold (Au) thin film 136 to form the second self-assembling monolayer 132a.

Figure 15:
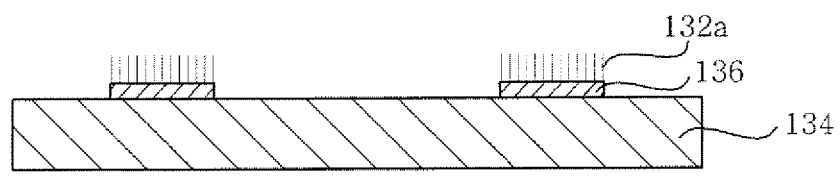

As shown in FIG. 15, when the substrate 134 is taken out of the chamber 140, the second self-assembling monolayer 132a is formed on the substrate 134.

Figure 16:
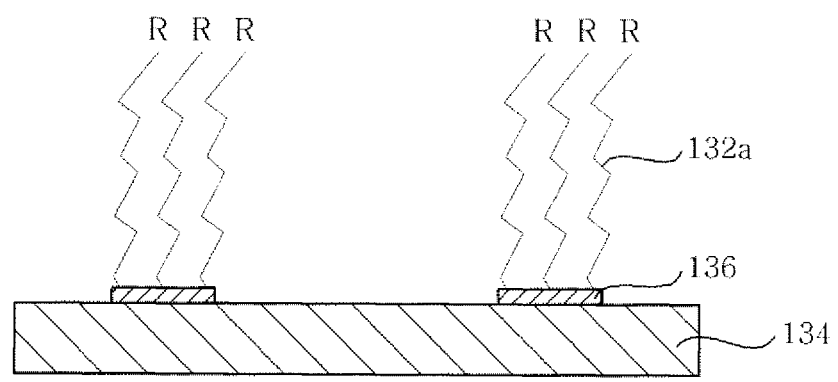

As shown in FIG. 16, the second self-assembling monolayer 132a may have at the end thereof the same hydrophilic or hydrophobic functional group (R) as that of an after-mentioned the first self-assembling monolayer 116 such that it can be aligned with the first self-assembling monolayer 116 of the die 110 using an attractive force acting therebetween.

In the step (S150), the die 110 is automatically aligned with the substrate 134 using the attractive force acting between the first and second self-assembling monolayers 116 and 132a. FIGS. 17 to 22 are drawings showing a process corresponding to the step (S150).

Figure 17:
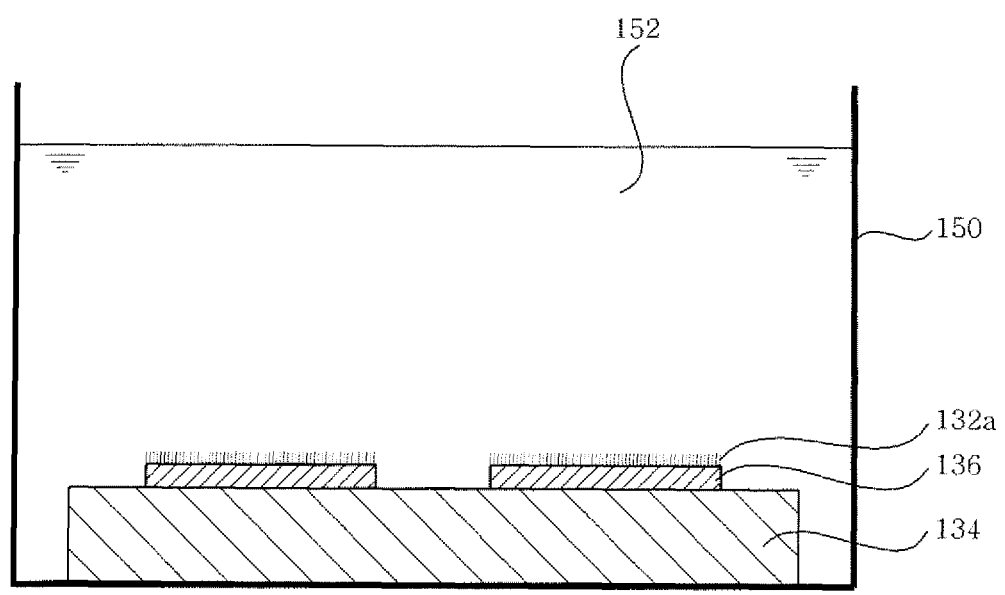
Figure 18:
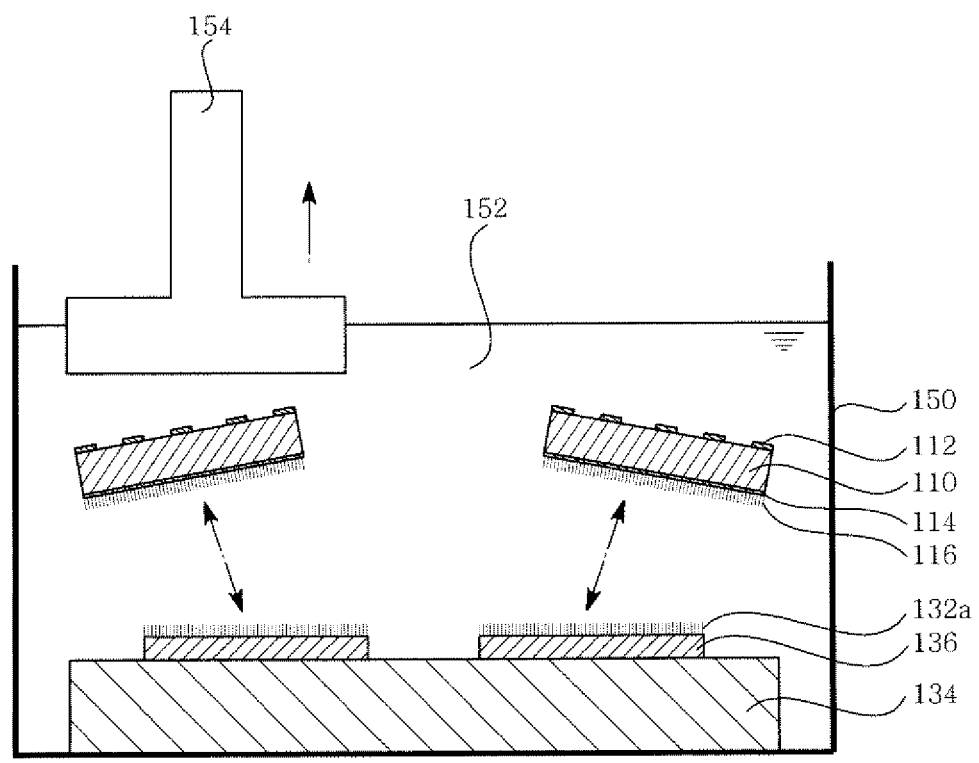
Figure 19:
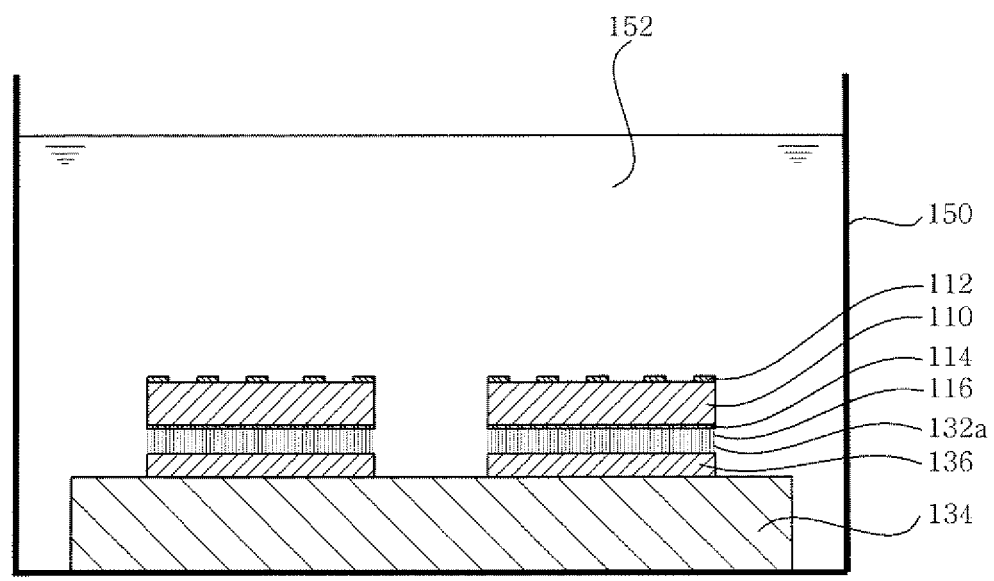

Among the drawings, FIGS. 17 to 19 show an embodiment of the process corresponding to this step (150). The process of mounting the die 110 on the substrate 134 will now be described with reference to the drawings. For reference, this embodiment may be applied in the case where the first and second self-assembling monolayers 116 and 132a have a hydrophobic functional group.

As shown in FIG. 17, the substrate 134 including the second self-assembling monolayer 132a formed thereon is immersed in solution 152 contained in an alignment chamber 150.

In this regard, the solution 152 may be aqueous solution or organic solution prepared by adding methanol, ethanol, acetone and the like to aqueous solution.

As shown in FIG. 18, the die 110 is picked up in a face-up manner using a pickup head 154, and is then transferred into the alignment chamber 150.

At this point, the die 110 may be transferred near the second self-assembling monolayer 132a on the substrate 134 using the pickup head 154.

As shown in FIG. 19, the die 110 is automatically aligned with the substrate 134 using attractive force acting between the first self-assembling monolayer 116 of the die 110 and the second self-assembling monolayer 132a of the substrate 134, i.e., between the hydrophobic functional groups (R) of the first and second self-assembling monolayers.

In other words, because an attractive force acts between the hydrophobic functional groups R in the solution, the die 110 is automatically aligned with the attach region of the substrate 134 and is mounted thereon.

Figure 20:
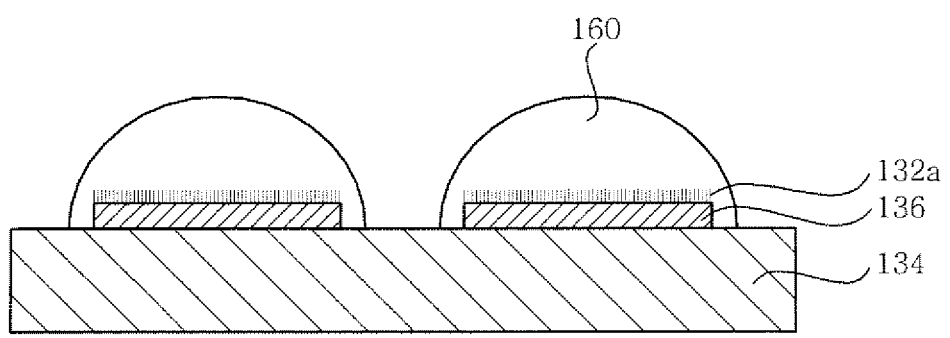
Figure 21:
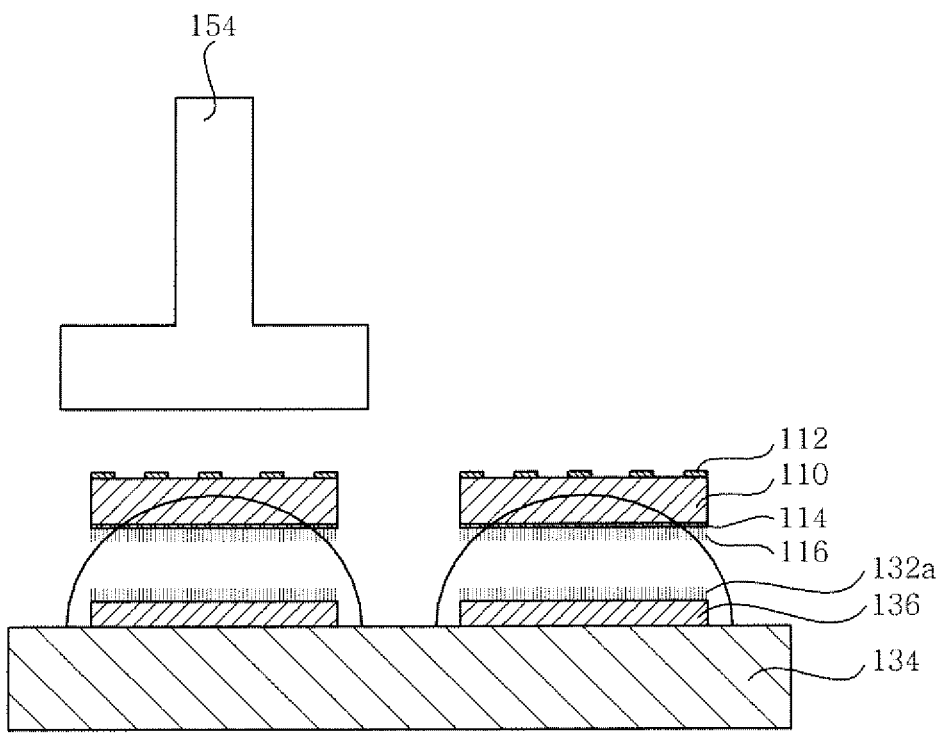
Figure 22:
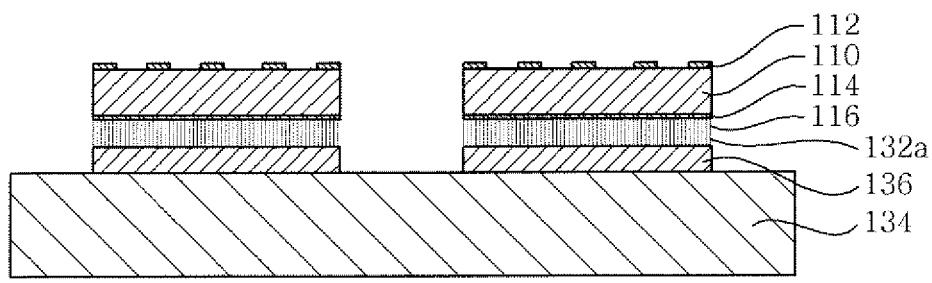

FIGS. 20 to 22 are cross-sectional views showing another embodiment of the process corresponding to the step (S150). The process of mounting the die 110 on the substrate 134 will be now described with reference to the drawings. For reference, this embodiment may be applied in the case where the first and second self-assembling monolayers 116 and 132*a* have a hydrophilic functional group.

As shown in FIG. 20, a solution drop 160 is formed on the second self-assembling monolayer 132*a* of the substrate 134. In this regard, the solution drop 160 may be, for example, a water drop.

As shown in FIG. 21, the die 110 is picked up in a face-up manner using the pickup head 154, and is then transferred into the solution drop 160.

As shown in FIG. 22, the die 110 is automatically aligned with the substrate 134 using attractive force acting between the first self-assembling monolayer 116 of the die 110 and the second self-assembling monolayer 132*a* of the substrate 134 in the solution drop 160, i.e., between the hydrophilic functional groups (R) of the first and second self-assembling monolayers.

In other words, because an attractive force acts between the hydrophilic functional groups R in the solution, the die 110 is automatically aligned with the attach region of the substrate 134 and is mounted thereon.

As described above, according to the present invention, since a die is precisely mounted on a substrate thanks to the self-alignment therebetween caused by self-assembling monolayers, there is no need for an imaging camera or an image-forming process using the imaging camera. Consequently, the present invention can achieve reduction of productions errors, improvement of mounting accuracy and reduction of a manufacturing time.

Furthermore, according to the present invention, since there is no need for various control devices for precisely controlling a die, production costs in attachment of the die can be minimized.

In addition, according to the present invention, since there is no need for an additional die attach film, production errors are eliminated and production costs are reduced.

Furthermore, according to the present invention, since there is no need for a recognition step through a slide glass, production errors are reduced and a mounting accuracy is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of attaching a die using a self-assembling monolayer, comprising:
   (A) forming a first self-assembling monolayer on one side of a die including a pad on the other side;
   (B) forming a second self-assembling monolayer on a die attach region on a substrate; and
   (C) picking up the die using a robotically-assisted-pick-and-place assembly, and transferring the die to the die attach region of the substrate immersed in an alignment chamber containing solution so that the die is automatically aligned with the substrate using an attractive force acting between the first and second self-assembling monolayers.

2. The method according to claim 1, wherein the first and second self-assembling monolayers have a hydrophilic or hydrophobic functional group.

3. The method according to claim 2, wherein, in the (C), the alignment between the die and the substrate is executed by the attractive force acting between the first and second self-assembling monolayers having the same functional group.

4. The method according to claim 1, wherein the (A) comprises:
   (A1) forming an insulating film on the one side of the die including the pad on the other side; and
   (A2) forming the first self-assembling monolayer on the insulating film.

5. The method according to claim 1, wherein the (B) comprises:
   (B1) coating a surface of a transfer stamp with a self-assembling molecule;
   (B2) applying a gold (Au) thin film on the substrate; and
   (B3) bringing the transfer stamp into contact with the substrate through a contact printing process thus forming the second self-assembling monolayer.

6. The method according to claim 5, wherein, in the (B1), the transfer stamp is made of silicon rubber or polydimethylsiloxane.

7. The method according to claim 1, wherein the (B) comprises:
   (B1) applying a gold (Au) thin film on the die attach region of the substrate; and
   (B2) dipping the substrate into a solution which is prepared by dissolving self-assembling molecules such as alkane thiol in ethanol solvent, so that the second self-assembling monolayer is formed on the gold (Au) thin film on the substrate.

8. The method according to claim 1, wherein the (C) comprises:
   (C1) disposing the substrate in a solution contained in an alignment chamber;
   (C2) picking up the die in a face-up manner using a pickup head and transferring the die into the alignment chamber; and
   (C3) automatically aligning the die with the substrate using the attractive force acting between the first and second self-assembling monolayers having a hydrophobic functional group.

9. The method according to claim 8, wherein, in the (C2), the die is transferred near the second self-assembling monolayer on the substrate using the pickup head.

10. The method according to claim 1, wherein the (C) comprises:
    (C1) forming a solution drop on the second self-assembling monolayer on the substrate;
    (C2) picking up the die in a face-up manner using the pickup head and transferring the die into the solution drop; and
    (C3) automatically aligning the die with the substrate using an attractive force acting between the first and second self-assembling monolayers having a hydrophilic functional group.

11. The method according to claim 10, wherein, in the (C1), the solution drop is a water drop.

* * * * *